United States Patent [19]

Sasagawa et al.

[11] Patent Number: 5,162,878
[45] Date of Patent: * Nov. 10, 1992

[54] LIGHT-EMITTING DIODE ARRAY WITH PROJECTIONS

[75] Inventors: Teruo Sasagawa, Kawasaki; Naoki Shibata, Yokohama; Tadao Kazuno, Yokohama; Hirokazu Ohta, Kawasaki, all of Japan

[73] Assignee: Eastman Kodak Company, Rochester, N.Y.

[ * ] Notice: The portion of the term of this patent subsequent to Oct. 8, 2008 has been disclaimed.

[21] Appl. No.: 85,764

[22] Filed: Dec. 12, 1991

[30] Foreign Application Priority Data

Feb. 20, 1991 [JP] Japan .................. 3-25921

[51] Int. Cl.$^5$ ........................................... H01L 33/00
[52] U.S. Cl. ........................................ 257/88; 372/45; 372/48; 346/107 R; 313/500; 362/800; 257/15; 257/95; 257/98
[58] Field of Search .................. 357/17, 45, 4, 16, 56, 357/52, 52 T, 55; 372/45, 46, 50, 48; 346/107 R, 160, 1.1; 313/500; 362/800

[56] References Cited

U.S. PATENT DOCUMENTS

| | | | |
|---|---|---|---|
| 5,005,057 | 4/1991 | Izumiya et al. | 357/17 |
| 5,040,044 | 8/1991 | Noguchi et al. | 357/52 |
| 5,055,893 | 10/1991 | Sasagawa | 357/17 |

Primary Examiner—William Mintel
Attorney, Agent, or Firm—Raymond L. Owens

[57] ABSTRACT

A light-emitting diode array having improved optical output efficiency and uniformity without loss of reliability or reproducibility is described. The array is formed of an n-type conductivity GaAs buffer layer on an n-type conductivity GaAs substrate, followed by 25-pair n-type conductivity $Al_yGa_{1-y}As/AlAs$ semiconductor multilayer mirror, a p-type conductivity $Al_xGa_{1-x}As$ active layer, and a p++ type conductivity GaAs contact layer. The surface of the emission region is a total reflection prevention surface with a sawtooth-shaped projection configuration. This provides a large decrease in total reflection loss of light from the emission layer, and also enables light propagating in the opposite direction to the output surface to be efficiently outputed.

23 Claims, 3 Drawing Sheets

LIGHT-EMITTING DIODE ARRAY WITH PROJECTIONS

FIELD OF THE INVENTION

The present invention relates to a light-emitting diode array, and, more particularly, to a homojunction or heterojunction light-emitting diode array used as a printing light source of an optical printer and comprising a multiplicity of light-emitting diodes closely arrayed on a single substrate.

BACKGROUND OF THE INVENTION

The advent of the age of electronic information has brought with it a need for printers able to print faster and with a higher print density. Laser printers, which employ a laser light source, and light emitting diode (LED) printers, which employ an LED array as the light source, are two examples of printers used in response to such needs. While a laser printer requires the use of a mechanical mechanism, such as a rotating polygonal mirror, for the scanning laser beam with an LED printer, it is only necessary for the light-emitting diodes (hereinafter also referred to as "light-emitting elements") that make up the light-emitting diode array to be electrically controlled. The advantages of LED printers compared with laser printers are that they do not have any mechanical moving parts, and therefore can be made smaller than laser printers and are faster and more reliable.

Referring now to FIG. 1 of the drawings, there is shown a cross-section view of a very typical example of a prior art conventional LED array 50. For simplicity only two light-emitting elements 58 are shown, but the array 50 can include any number of the light-emitting elements 58. The array 50 comprises a substrate 51 of n-type conductivity GaAs having on a surface 51a thereof a layer 52 of n-type conductivity GaAsP. The GaAsP layer 52 is typically about 15 microns thick and can be deposited on the substrate 51 by vapor-phase epitaxy (VPE). A masking layer 53 of $SiN_x$ is on the GaAsP layer 52 has a pair of spaced openings therethrough. P-type conductivity diffused regions 54 are in the GaAsP layer 52 at each of the openings 59 in the masking layer 53. The diffused regions 54 are formed by diffusing zinc into the GaAsP layer 52 through the openings 59 to a depth of about 1.5 microns. A p-n junction between each of the diffused regions 54 and the GaAsP layer 52 forms a separate light-emitting element 58. A separate electrode 55 is on each of the diffused regions 54 and an electrode 56 is on a surface 51b of the substrate 51. An antireflection layer 57 of $SiN_x$ is over the masking layer 53, the exposed areas of the diffused regions 54 and the electrodes 55. The antireflection layer 57 has an opening therethrough (not shown) over a portion of the array 50 which does not contain a light-emitting element 58 to form a bonding pad for the electrodes 55.

A problem encountered when the light-emitting diode array 50 is used as a printer light source, unlike when individual LEDs are used, is that of variation in characteristics from element 58 to element 58. In the conventional example shown in FIG. 1, the light-emitting region formed by the diffused region 54 is formed simply by using zinc diffusion, thereby reducing variation caused by non-uniformities in the fabrication process.

However, light-emitting elements 58 thus formed contain high-density lattice defects which arise from a lack of lattice matching between the n-type conductivity GaAsP layer 52 and the GaAs substrate 51. This produces considerable non-uniformity of the material itself and a low emission efficiency. Moreover, the light-emitting region is a p-n homojunction which is not the most suitable type from the standpoint of emission efficiency.

Referring now to FIG. 2, there is shown a cross-sectional view of a prior art AlGaAs single heterojunction type light-emitting diode array 60 which overcomes the drawbacks of the conventional GaAsP light-emitting diode array 50, shown in FIG. 1. The array 60 comprises a p-type conductivity GaAs substrate 61 having on a surface 61a thereof a layer 62 of p-type conductivity $Al_xGa_{1-x}As$. The layer 62 is about 10 microns in thickness and contains a doping concentration of zinc of about $5 \times 10^{17}$ impurities/cm$^3$. On the p-type layer 62 is a layer 63 of n-type conductivity $Al_yGa_{1-y}As$. The layer 63 is of a thickness of about 5 microns and contains a doping concentration of Te of about $8 \times 10^{17}$ impurities/cm$^3$. Spaced grooves extend through the n-type conductivity layer 63 and a portion of the p-type conductivity layer 62 to form separated mesa-shaped light-emitting regions 69. On a portion of the n-type conductivity layer 63 of each of the light emitting regions 69 is a layer 64 of n+ type conductivity GaAs. The layers 64 are of a thickness of about 0.1 microns and are doped with Sn to a concentration of about $5 \times 10^{18}$ impurities/cm$^3$. For emitting light with a wavelength in the region of 720 nm, the aluminum composition in the layers 62 and 63 is x=0.2 and y=0.5.

A protective layer 66 of $SiN_x$ is over the surfaces of the grooves. A separate electrode 65 is on each of the GaAs layers 64 and an electrode 67 is on a surface 61b of the substrate 61. An antireflection layer 68 of $SiN_x$ is over the protective layer 66, the surface of the layers 63 and the electrodes 65.

The array 60 is made by epitaxially depositing on the substrate 61 in succession the p-type layer 62, the n-type layer 63 and the GaAs layer 64. This can be achieved by liquid-phase epitaxy. A masking layer, not shown, of $SiN_x$ is then deposited over the GaAs layer 64 and defined to extend over the areas which are to be the mesas using standard photolithography and plasma etching. Using a chemical etching with $H_2SO_4:H_2O_2:H_2O = 1:8:80$ the exposed areas of the GaAs layer 64 and the underlying areas of the p-type conductivity layer 63 and n-type conductivity layer 62 are removed to form the grooves 68. The grooves 68 may extend 1 micron or more into the n-type layer 62.

The protective layer 66 is then deposited by plasma CVD and is etched away from over the top surfaces of the light-emitting regions 69. The electrodes 65 and the electrode 67 are formed by vapor deposition. The unnecessary portions of the electrodes 65 are then removed by photolithography and plasma etching. Using a chemical etchant of $NH_4OH:H_2O_2 = 1:10$, the GaAs layer 64 is removed except for the portion under the n-side electrodes 65. Finally, the antireflective layer 68 is formed by plasma CVD, and the device is heated to alloy the electrodes 65 and 67.

Structurally, the array 60 is an array of conventional high-luminance LEDs. This arrangement of the array 60 suppresses optical energy attenuation caused by internal absorption by using the n-type conductivity $Al_yGa_{1-y}As$ layer 63 which is transparent to light emitted by the p-type conductivity $Al_xGa_{1-x}As$ layer 62. Also, as well as using a junction with good crystalline growth qualities, the heterojunction improves the carrier injection efficiency and results in an overall external output efficiency that is several times higher than that achievable with the light-emitting diode array shown in FIG. 1.

While the type of light-emitting diode array 60 shown in FIG. 2 has excellent characteristics, the necessity of suppressing optical crosstalk between elements means the n-type conductivity $Al_yGa_{1-y}As$ layer 63 used as a window has to be completely removed between elements, and non-mesa portions of the p-type $Al_xGa_{1-x}As$ layer 62 that form the emission region have to be etched down to a certain minimum depth to reduce optical bleeding.

The diffusion length of minority carrier electrons injected into the p-type $Al_xGa_{1-x}As$ layer 62 decreases with the distance from the p-n junction. Since this distance is in the order of 10 microns, at least about 10 microns of the p-type conductivity $Al_xGa_{1-x}As$ layer 62 has to be etched away. However, it is difficult to etch that deep with adequate process uniformity and reproducibility. Thus, some degree of optical bleeding is unavoidable.

Furthermore, the p-type $Al_xGa_{1-x}As$ layer 62 that is within the diffusion length of electrons from the p-n junction functions effectively as an emission layer. Thus, in order to optimize the emission efficiency, it is necessary to make the p-type $Al_xGa_{1-x}As$ layer 62 at least 10 microns thick. A problem is, however, that even if the mission efficiency is improved, owing to the high refractive index of the light-emitting portion, most of the light is lost through total reflection. This results in a very low external light output efficiency of no more than several percent. Yet another problem in the case of a light-emitting diode array is that the priority is on reliability and reproducibility, while the small size of the discrete elements makes it exceedingly difficult to directly mount a lens or the like on individual elements.

Referring now to FIG. 3, there is shown a cross-sectional view of a light-emitting diode array 82 which we have previously proposed in which an optical output surface is processed to prevent reflection. The array 82 comprises a substrate 70 of n-type GaAs having on a surface 70a thereof a layer 71 of n-type GaAsP. The layer 71 is about 15 microns in thickness and is epitaxially deposited on the substrate 70 by vapor phase epitaxy. On a surface of the layer 71 is a masking layer 74 of $SiN_x$ having a pair of a spaced apart openings 83 therethrough. P-type conductivity diffused regions 76 are in the layer 71 at each of the openings 83 in the masking layer 74. Diffused regions 76 are formed by diffusing zinc through the openings 83 into the layer 71. Projections 78 are formed along the surface of the diffused regions 76. The pitch of the projections 78, i.e., the spacing between the projections 78, ranges from less than a micron to several microns. The projections 78 are at an inclination of 45° and are only formed in a direction perpendicular to the [011] orientation of the GaAsP. The projections 78 are formed using photolithography and etching. A separate electrode 80 is on each of the diffused regions 76 and an electrode 81 is on a surface 70b of the substrate 70.

In the array 82, the inclination of the projections 78 changes the angle at which light generated in the diffused regions 76 is incident on the surface of the diffused regions 76. This makes it possible to achieve an external light output even at an angel at which, previously, all the light would have been reflected back into the diffused regions 76.

Although the array 82 provides for improved output of the light generated in the light-emitting elements, a problem arose With regard to the processing of the array 82. The process for making the projections 78 has instabilities, such as inadequate surface etching and the like. This produces reflection loss from flat portions, decreasing output efficiency and causing variation in emission output.

SUMMARY OF THE INVENTION

The present invention provides a light-emitting diode array that offers improved optical output efficiency and improved light output uniformity without loss of reliability or reproducibility.

In the present invention this is attained by a light-emitting diode array comprising a multiplicity of light-emitting diodes arranged on a single substrate, each light-emitting diode having an active layer which emits light when subjected to carrier injection and a light emitting surface. The light emitting surface has means for reflection prevention so a to prevent reflection of light from the active layer.

In the light-emitting diode array thus constituted in accordance with this invention, projections or the like are fabricated on the output surface to form a total reflection prevention surface and a mirror is formed between the active layer and the substrate, causing light going toward the substrate from the active layer to be reflected and emitted from the output surface, thereby improving optical output efficiency.

Further features of the invention, its nature and various advantages will become more apparent from the accompanying drawings and following detailed description of the invention.

Figure 1:
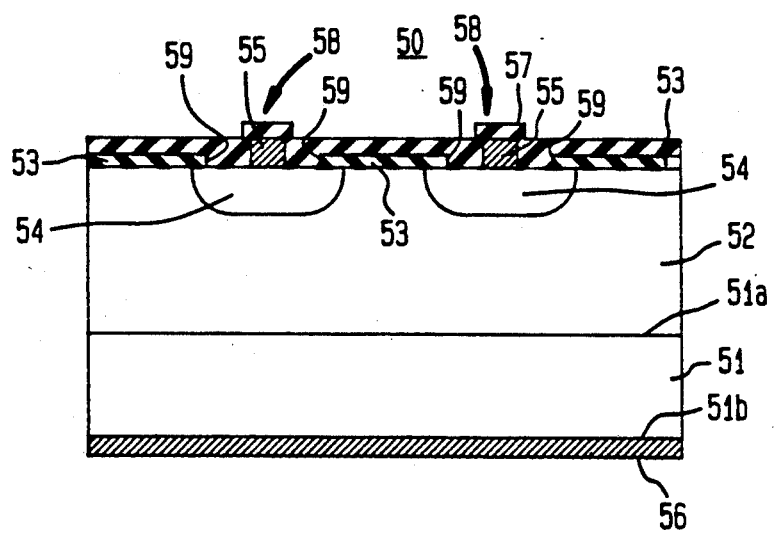
FIG. 1 is a cross-sectional view of a conventional light-emitting diode array arrangement.
Figure 2:
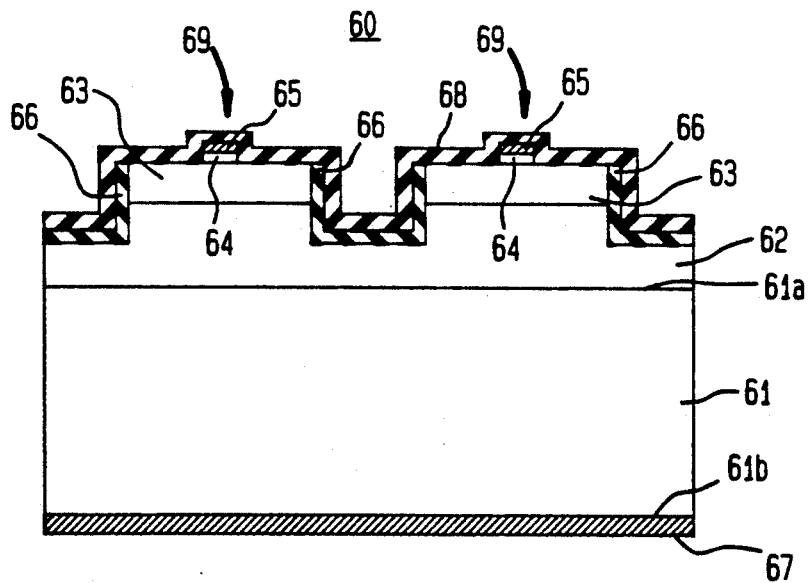
FIG. 2 is a cross-sectional view of a conventional single heterojunction light-emitting diode array.
Figure 3:
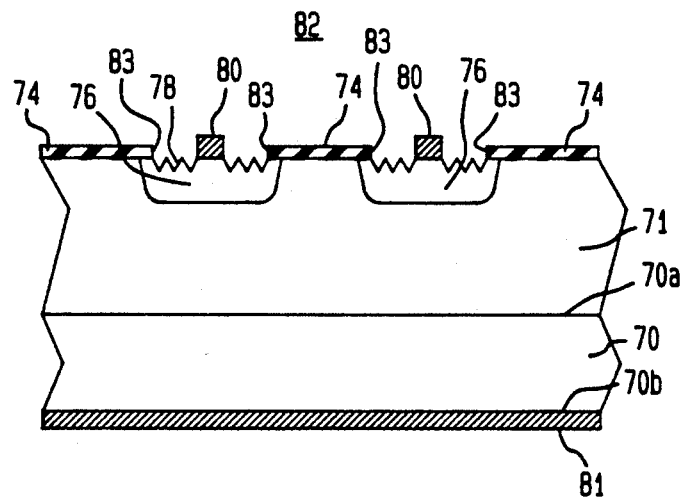
FIG. 3 is a cross-sectional view of a surface-processed light-emitting diode array.

The figures of the drawing are not necessarily to scale.

DETAILED DESCRIPTION

Figure 4:
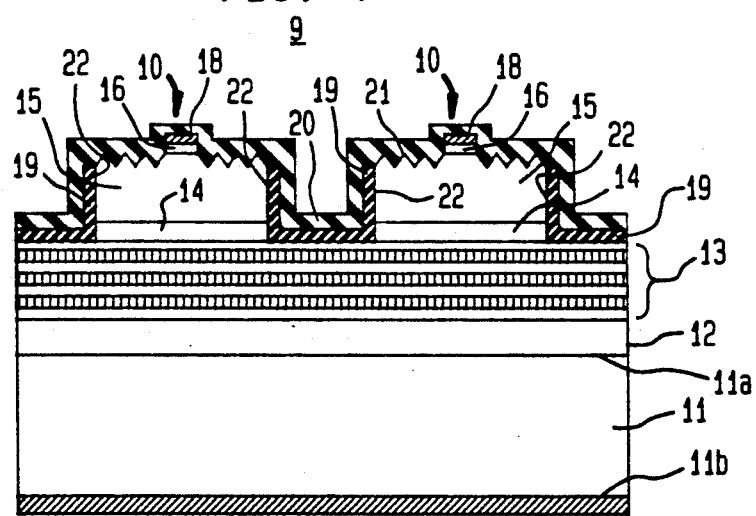
FIG. 4 is a cross-sectional view of a light-emitting diode array in accordance with a first embodiment of the present invention.

Referring now to FIG. 4, there is shown a cross-sectional view of an AlGaAs light-emitting diode array 9 in accordance with the present invention. For simplicity, the array 9 is shown as having only two light-emitting elements 10.

The array 9 comprises a substrate 11 of n-type conductivity GaAs which is doped with Si to a concentration of about $1 \times 10^{18}$ impurities/cm³. On a surface 11a of the substrate 11 is a buffer layer 12 of n-type conductivity GaAs. The buffer layer 12 is of a thickness of about 0.2 microns and is doped with Se to a concentration of about $1 \times 10^{18}$ impurities/cm$^3$. On the buffer layer 12 is a semiconductor multilayer mirror 13 form of N-pairs (where N is an integer) of alternating semiconductor layers having different refractive indices, such as n-type conductivity Al$_y$Ga$_{1-y}$As/AlAs. The layers of the mirror 13 are doped with Se to a concentration of about $5 \times 10^{18}$ impurities/cm$^3$. A p-type conductivity active layer 14 of Al$_x$Ga$_{1-x}$As is on the mirror 13. The active layer 14 is about 0.5 microns in thickness and is doped with Zn to a concentration of about $5 \times 10^{18}$ impurities/cm$^3$. On the active layer 14 is a cladding layer 15 of p-type conductivity Al$_z$Ga$_{1-z}$As of a thickness of about 1.5 microns and doped with Zn to a concentration of about $5 \times 10^{18}$ impurities/cm$^3$. Finally, a contact layer 16 of p-type conductivity GaAs is on the cladding layer 15. The contact layer 16 is about 0.05 microns in thickness and is doped with Zn to a concentration of about $1 \times 10^{19}$ impurities/cm$^3$.

To obtain an emission of light with a wavelength of around 670 nm, the Al content in the layers formed of AlGaAs is set at $x=0.3$, $y=0.1$ and $z=0.7$. The number of pairs N of the semiconductor multilayer mirror 13 is set at around $N=25$ to obtain adequate reflectivity, and the refractive index of the Al$_y$Ga$_{1-y}$As and AlAs is set to around 3.7 and 3.0, thus setting the optical thickness at more or less one-quarter the wavelength of the emitted light.

Spaced grooves 22 extend through the contact layer 16, cladding layer 15 and the active layer 14 to the mirror 13. This forms the separated mesa-like light emitting elements 10. The contact layer 16 for each light emitting element 10 is smaller than the width of the cladding layer 15 of the light emitting element 10. The surface of the cladding layer 15 of each light emitting element 10 on each side of the contact layer 16 has sawtooth-shaped projections 21 therein. The pitch of the projections 21, (i.e., the spacing between projections) is between less than one micron to several microns, and the inclination of the projections is typically about 45°. The surfaces of the grooves 22 have an insulating layer 19 of SiN$_x$ thereon. An electrode 17 is on a surface 11b of the substrate 11 opposite the buffer layer 12, and a separate electrode 18 is on the contact layer 16 of each of the light emitting elements 10. An antireflection layer 20 of SiN$_x$ covers the light emitting elements 10 and the insulating layer 19.

The array 9 is made by depositing on the substrate 11 in succession the buffer layer 12, the mirror 13, the active layer 14, the cladding layer 15 and the contact layer 16 using MOCVD (metal organic). A masking layer of SiN$_x$ is deposited on the contact layer 16 using plasma CVD. The masking layer is defined using photolithography and plasma etching to form openings therethrough where the projections 21 are to be formed. Next, using an chemical etchant of H$_2$SO$_4$:H$_2$O$_2$:H$_2$O$=1$:8:80, the projections 21 are etched into the surface of the cladding layer 15. Another masking layer of SiN$_x$ is then deposited on the device and defined, using photolithography and plasma etching, to have openings therethrough where the grooves 22 are to be formed. Etching is carried out using the etchant described above to form the grooves 22 which extend through the cladding layer 15 and active layer 14 to the mirror 13.

Plasma CVD is then used to form the SiN$_x$ insulation layer 19, and photolithography and plasma etching are used to etch away the portion of the SiN$_x$ layer 19 over the light emitting element 10. The electrode 17 and the electrodes 18 are formed by vapor deposition. The unnecessary portions of the electrodes 18 are then removed by photolithography and plasma etching. NH$_4$OH:H$_2$O$_2$=1:10 chemical etching is then used to remove the GaAs contact layer 16 except for the portions under the electrodes 18. Finally, the antireflection SiN$_x$ layer 20 is formed by plasma CVD, which is followed by alloying and the use of photolithography and plasma etching to form an electrode bonding pad section (not shown) separated from the light-emitting portion.

In the light-emitting diode array 9, the large decrease in total reflection loss of light from the emission layer 14 obtained by forming the optical output surface as a total reflection prevention surface 21 having sawtooth-shaped projections results in an optical output efficiency that is twice as good compared to when there are flat surface portions. In addition, providing the semiconductor multilayer mirror 13 between the emission layer 14 and the GaAs substrate 11 also enables efficient output of light that propagates in the opposite direction to the output surface. Also, in the event that flat surface portions are formed owing to inadequate etching or the like, the provision of the semiconductor multilayer mirror 13 enables the total reflection component to be efficiently outputed. This enables non-uniformity of the light intensity arising from etching inadequacy or instability to be decreased.

Figure 5:
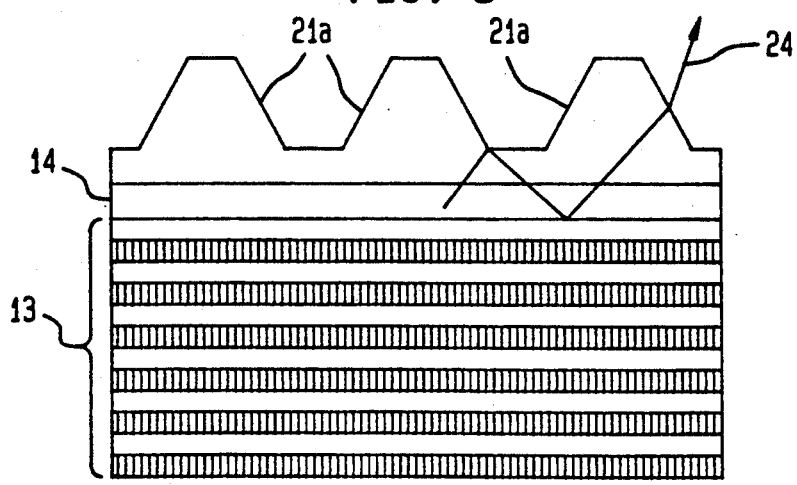
FIG. 5 is an explanatory diagram showing the reflection of light of the array of FIG. 4.

FIG. 5 is a cross-sectional view of a portion of a light emitting element array 9 of FIG. 4 in accordance with the present invention which shows the light path when flat top surface portions 21a have been formed owing to inadequate etching as compared to pointed portions 21 of FIG. 4. It can be seen that light, indicated by line 24, reflected by the flat portion 21a is again reflected by the semiconductor multilayer mirror 13 and can, therefore, be outputed to the exterior.

Using the semiconductor multilayer mirror 13 in the array 9 permits the thickness of the p-type Al$_x$Ga$_{1-x}$As emission layer 14 to be reduced to 0.5 microns or less. This is far thinner than in a conventional arrangement, so the height of the light-emitting mesas can be made lower than in the conventional arrangement. This also reduces non-uniformity arising from the etching process. If necessary the thickness of the layer 14 can be reduced to several hundred angstroms or less.

Figure 6:
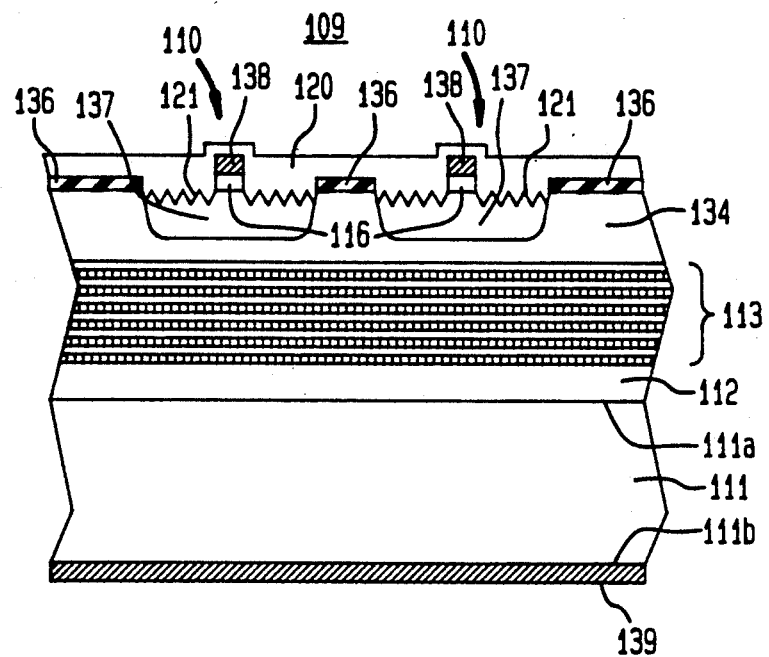
FIG. 6 is a cross TM sectional view of a light-emitting diode array in accordance with a second embodiment of the present invention.

Referring to FIG. 6, there is shown a cross-sectional view of a light-emitting diode array 109 in accordance with the invention. Again, for simplicity, only two light-emitting elements 110 are shown. The light-emitting diode array 109 comprises a substrate 111 of n-type conductivity GaAs which is doped with Si to a concentration of $1 \times 10^{18}$ impurities/cm$^3$ having on a surface 111a thereof a buffer layer 112 of n-type conductivity GaAs. The buffer layer 112 is about 0.2 microns in thickness and is doped with Se to a concentration of about $1 \times 10^{18}$ impurities/cm$^3$. On the buffer layer 112 is a 25-pair semiconductor multilayer mirror 113 of n-type conductivity Al$_y$Ga$_{1-x}$As/AlAs which are doped with Se to a concentration of about $5 \times 10^{18}$ impurities/cm$^3$. On the mirror 113 is an emission layer 134 of n-type conductivity Al$_x$Ga$_{1-x}$As of a thickness of about 1.7 microns. Within portions of the emission layer 134 are a pair of spaced apart diffused active regions 137 which are of p-type conductivity and are doped with zinc. Each of the active regions 137 forms with the emission layer 134 a p-n junction light-emitting element 110. On each of the active regions 137 is a contact layer 116 of p+ type conductivity GaAs. The contact layers 116 are each of a thickness of about 0.05 microns and are doped with zinc to a concentration of about $1 \times 10^{19}$ impurities/cm$^3$. For emitting light with a wavelength in the region of 720 nm., the aluminum composition in the layers formed of AlGaAs is set at x=0.2, and y=0.3.

A separate side electrode 138 is on each of the contact layers 116 and an electrode 139 is on a surface 111b of the substrate 111. An antireflection layer 120 of SiNx is over the masking layer 136, projections 121 of regions 137 and the electrodes 138.

The array 109 is made by epitaxially depositing in succession on the substrate 111 using MOCVD the buffer layer 112, the mirror 113, the emission layer 134 and the contact layer 116. The masking layer 116 is defined to form the individual contact layers 116. The masking layer 136 is then deposited on the exposed surface of the emission layer 134 and is defined to have openings therethrough where the diffused regions 137 are to be formed. Zinc is then diffused through the openings in the masking layer 136 into the emission layer 134 to form the diffused regions 137. Another masking layer of SiNx is then deposited over the device using plasma CVD and is defined to have openings therethrough where the projections are to be formed. Next, the surface of the diffused regions 137 is etched using $H_2SO_4:H_2O_2:H_2O = 1:8:80$ to form the projections 121. After the masking layer is removed, the electrodes 138 are formed on the contacts 116 and the electrode 139 is formed on the surface 111b of the substrate 111. Finally, the antireflection layer 120 is deposited by plasma CVD. This is followed by alloying of the electrodes and the use of photolithography and plasma etching to form a p-side electrode bonding pad (not shown) separated from the light-emitting region 110.

Figure 7:
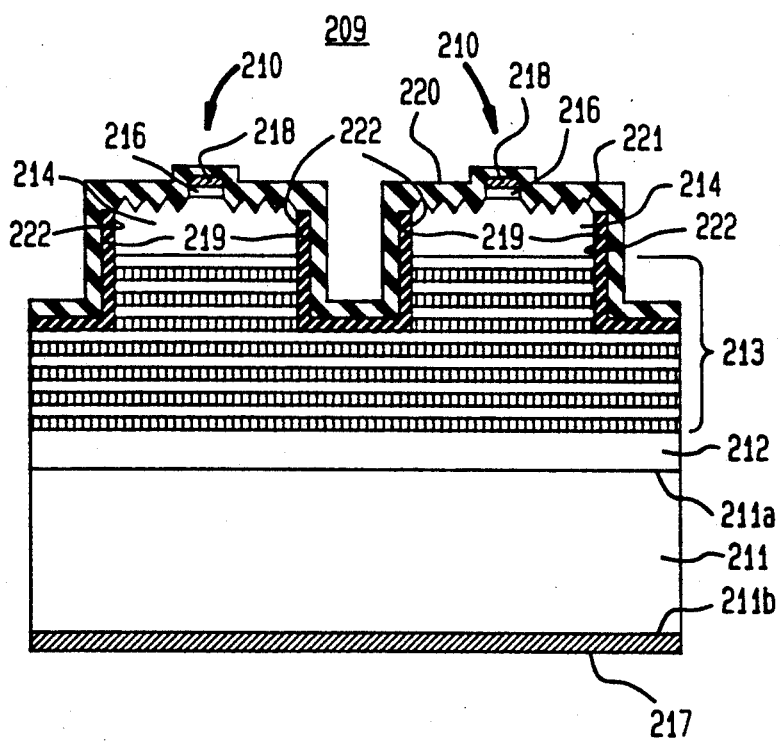
FIG. 7 is a cross-sectional view of a light-emitting diode array in accordance with a third embodiment of the present invention.

Referring to FIG. 7, there is shown a cross-sectional view of a light-emitting diode array 209 in accordance with the present invention. As in the arrays 9 and 109, for simplicity, only two light-emitting elements 210 are shown. The array 209 comprises a substrate 211 of n-type conductivity GaAs which is doped with Si to a concentration of $1 \times 10^{18}$ impurities/cm$^3$. On a surface 211a of the substrate 211 is a buffer layer 212 of n-type conductivity GaAs which is 0.2 microns in thickness and is doped with Se to a concentration of $1 \times 10^{18}$ impurities/cm$^3$. A 25 pair semiconductor multilayer mirror 213 of n-type conductivity Al$_y$Ga$_{1-y}$As/AlAs is on the buffer layer 212. The mirror 213 is doped with Se to a concentration of $5 \times 10^{18}$ impurities/cm$^3$. On the mirror 213 is an active layer 214 of p-type conductivity Al$_x$Ga$_{1-x}$As of a thickness of 0.5 microns and doped with Zn to a concentration of $1 \times 10^{18}$ impurities/cm$^3$. To obtain an emission of light with a wavelength of around 670 nm., the Al content in the AlGaAs layers is set at x=0.3 and y=0.7.

Spaced apart grooves 222 extend through the active layer 214 and a portion of the mirror 213 to form the mesa-like light emitting elements 210. An insulating layer 219 of SiNx covers the surface of the grooves 222. A separate contact layer 216 of p+ type conductivity GaAs is on a portion of the surface of the active layer 214 of each light emitting element 210. Each contact layer 216 is of a thickness of about 0.05 microns and is doped with Zn to a concentration of $1 \times 10^{19}$ impurities/cm$^3$. A surface of the active layer 214 of each light emitting element 210 has reflection preventing projections 221 therein. An electrode 218 is on each of the contacts 216 and an electrode 217 is on a surface 211b of the substrate 211 opposite the buffer layer 212. An antireflection layer 220 of SiNx is over the insulating layer 219, the projections 221 and the electrodes 218.

The array 209 is made by epitaxially depositing by MOCVD on the surface 211a of the substrate 211 in succession the buffer layer 212, the mirror 213, the active layer 214 and the contact layer 216. A masking layer of SiNx is then deposited on the contact layer 215 by plasma CVD and is defined, using photolithography and plasma etching, to be over the area of the device which the grooves 222 are to be formed leaving exposed the area where the light emitting elements 210 are to be formed. The contact layer 216 is then defined to form the individual contacts for each light-emitting element 210. Next, $H_2SO_4:H_2O_2:H_2O = 1:8:80$ chemical etching is used to form the projections 221. The masking layer is removed and a second masking layer of SiNx is applied and defined to extend over the areas where the light-emitting elements 210 are to be formed. Then using the etchant described above, the uncovered areas of the device are etched away through the contact layer 216, the active layer 214 and partially into the mirror 213 to form the grooves 222.

Plasma CVD is then used to form the SiNx insulation layer 219, and photolithography and plasma etching are used to etch away the portion of the SiNx layer which is over the light emitting elements 210. The electrode 217 and the electrode 218 are formed by vapor deposition. The unnecessary portions of the electrode 218 are then removed by photolithography and plasma etching. Finally, the antireflection SiNx layer 220 is formed by plasma CVD, which is followed by alloying and the use of photolithography and plasma etching to form an electrode bonding pad section (not shown) separated from the light-emitting portion.

In the light-emitting diode array 209, the first Al$_y$Ga$_{1-y}$As layer of the semiconductor multilayer mirror 213 from the optical output side is formed as a single heterojunction structure that is an effective carrier barrier layer that raises emission efficiency. Also, the total reflection prevention surface provided with a mirror and sawtooth-shaped projections produces a major increase in optical output efficiency.

Thus, there is provided by the present invention and array of light emitting elements each having an internal mirror and a reflection prevention surface. This increases the output efficiency of the light emitting elements and reduces cross-talk between the light emitting elements in the array.

It is to be appreciated and understood that the specific embodiments of the invention are merely illustrative of the general principles of the invention. Various modifications may be made consistent with the principles set forth. For example, each of the light-emitting diode arrays has been described with reference to specific thickness and compositions such as GaAs and AlGaAs. However, different compositions such as InGaAsP/InP may be used to produce different refractive indexes as required, and semiconductor substances that can be formed in alternating layers may also be used. Still further, although the light-emitting elements have been described with the total reflection surface having a sawtooth configuration, it is also possible to use other surface configurations, such as pyramidal or rectangular, or has a Fresnel pattern or a dot pattern, for example. Furthermore, instead of the wet etching method used to form the total reflection prevention surface, a dry etching method can be used, such as plasma etching, reactive beam etching, reactive ion-beam etching, ion-beam etching, chemical-assisted ion-beam etching, and so forth.

What is claimed is:

1. A light-emitting diode array comprising:
    a multiplicity of light-emitting diodes arrayed on a single substrate, each light-emitting diode having an active layer which emits light when subjected to carrier injection, and an optical output surface;
    projections on said optical output surface for reflection prevention so as to limit reflection of light from the active layer; and
    a reflective mirror between the substrate and the active layer.

2. The light-emitting diode array of claim 1 in which the projection have a pitch which is between less than a micron to several microns.

3. The light-emitting diode array of claim 2 in which the projections have an inclination which is about 45°.

4. The light-emitting diode array of claim 1 in which the reflective mirror comprises a multiplicity of alternating semiconductor layers having different reflective indices.

5. A light-emitting diode array comprising:
    a substrate of one conductivity type having a surface;
    spaced light-emitting elements on said surface of the substrate;
    each of said light-emitting elements comprises an active layer of a conductivity type opposite that of the substrate and a light emitting surface;
    a mirror between each of the active layers and the substrate; and
    projections on the light-emitting surface of each of the light-emitting elements to prevent reflection of the light.

6. The light-emitting diode array of claim 5 in which each of the light-emitting elements is in the form of a mesa on the substrate.

7. The light-emitting diode array of claim 6 further comprising a buffer layer of the same conductivity type as the substrate between the substrate and the mirror.

8. The light-emitting diode array of claim 7 in which the active layer provides the light-emitting surface of each light-emitting element and the reflection prevention projections are in the surface of the active layer.

9. The light-emitting diode array of claim 7 further comprising a cladding layer of the same conductivity type as the active layer over the active layer and providing the light-emitting surface of each light-emitting element, and wherein the reflection prevention projections are in the surface of the active cladding layer.

10. The light-emitting diode array of claim 7 in which the mirror comprises a multiplicity of alternating semiconductor layers having different refractive indices.

11. The light-emitting diode array of claim 10 in which the mirror comprises alternating layers of AlGaAs and AlAs.

12. The light-emitting diode array of claim 11 in which there are 25 pairs of the alternating layers of the mirror.

13. The light-emitting diode array of claim 12 in which the substrate and buffer layer are of GaAs and the active layer is of AlGaAs.

14. The light-emitting diode array of claim 13 in which the substrate, buffer layer and mirror are of n-type conductivity and the active layer is of p-type conductivity.

15. The light-emitting diode array of claim 7 further comprising a separate contact on the light emitting surface of leach of the light-emitting elements and a contact on the surface of the substrate opposite the active layer.

16. The light-emitting diode array of claim 5 further comprising an emission layer of the same conductivity type as the substrate over the mirror, and wherein the active layers are spaced regions of the opposite conductivity type in the emission layer, and each of the active layers has a light emitting surface.

17. The light-emitting diode array of claim 16 further comprising a buffer layer of the same conductivity type as the substrate between the substrate and the mirror.

18. The light-emitting diode array of claim 17 in which the mirror comprises a multiplicity of alternating semiconductor layers having different refractive indices.

19. The light-emitting diode array of claim 18 in which the mirror comprises alternating layers of AlGaAs and AlAs.

20. The light-emitting diode array of claim 19 in which there are 25 pairs of the alternating layers of the mirror.

21. The light-emitting diode array of claim 20 in which the substrate and buffer layer are of GaAs and the emission layer and active regions are of AlGaAs.

22. The light-emitting diode array of claim 21 in which the substrate, buffer layer and mirror are of n-type conductivity and the emission layer and active regions are of p-type conductivity.

23. The light-emitting diode array of claim 22 further comprising a separate contact on each of the active regions and a contact on the surface of the substrate opposite the buffer layer.

* * * * *

UNITED STATES PATENT AND TRADEMARK OFFICE
CERTIFICATE OF CORRECTION

PATENT NO. : 5,162,878
DATED : 11/10/92
INVENTOR(S) : Teruo Sasagawa et al

It is certified that error appears in the above-indentified patent and that said Letters Patent is hereby corrected as shown below:

On the title page, item [21], the Appl. No. should read --805,764--.

Signed and Sealed this

Fifteenth Day of March, 1994

Attest:

BRUCE LEHMAN

Attesting Officer

Commissioner of Patents and Trademarks

UNITED STATES PATENT AND TRADEMARK OFFICE
CERTIFICATE OF CORRECTION

| | | |
|---|---|---|
| PATENT NO. | : 5,162,878 | |
| APPLICATION NO. | : 07/805764 | |
| DATED | : November 10, 1992 | |
| INVENTOR(S) | : Sasagawa et al. | |

It is certified that error appears in the above-identified patent and that said Letters Patent is hereby corrected as shown below:

Title page, item [21]
Application No: Please delete "85,764" and insert -- 07/805,764 --

Notice: Please replace "The portion of the term of this patent subsequent to October 8, 2008 has been disclaimed" with the following -- The portion of the term of this patent subsequent to January 30, 2011 has been disclaimed --

Signed and Sealed this

Eighteenth Day of November, 2008

JON W. DUDAS
*Director of the United States Patent and Trademark Office*